(12) United States Patent
Schuegraf

(10) Patent No.: US 6,459,104 B1
(45) Date of Patent: Oct. 1, 2002

(54) METHOD FOR FABRICATING LATERAL PNP HETEROJUNCTION BIPOLAR TRANSISTOR AND RELATED STRUCTURE

(75) Inventor: Klaus F. Schuegraf, Aliso Viejo, CA (US)

(73) Assignee: Newport Fab, Newport Beach, CA (US)

(*) Notice: Subject to any disclaimer, the term of this patent is extended or adjusted under 35 U.S.C. 154(b) by 0 days.

(21) Appl. No.: 09/853,735

(22) Filed: May 10, 2001

(51) Int. Cl.[7] .......................................... H01L 31/0328
(52) U.S. Cl. ....................................... 257/197; 257/192
(58) Field of Search ................................ 257/197, 192, 257/593; 437/31; 438/309

(56) References Cited

U.S. PATENT DOCUMENTS

| | | | | | |
|---|---|---|---|---|---|
| 5,194,397 | A | * | 3/1993 | Cook et al. .................... | 437/31 |
| 5,422,502 | A | * | 6/1995 | Kovacic ........................ | 257/197 |
| 5,440,152 | A | * | 8/1995 | Yamazaki ..................... | 257/197 |
| 5,581,114 | A | * | 12/1996 | Bashir et al. ................. | 257/588 |
| 5,604,374 | A | * | 2/1997 | Inou et al. .................... | 257/593 |
| 5,734,183 | A | * | 3/1998 | Morishita ..................... | 257/197 |
| 5,798,277 | A | * | 8/1998 | Ryum et al. .................. | 437/31 |
| 5,912,479 | A | * | 6/1999 | Mori et al. ................... | 257/192 |
| 6,265,275 | B1 | * | 7/2001 | Marty et al. ................. | 438/309 |

OTHER PUBLICATIONS

U.S. patent application U.S. 2001/0009793 by Sato : high speed and low parasitic capacitance semiconductor.*

* cited by examiner

Primary Examiner—David Nelms
Assistant Examiner—Thinh Nguyen
(74) Attorney, Agent, or Firm—Farjami & Farjami LLP

(57) ABSTRACT

According to one embodiment, a dielectric layer is deposited over an n-well. For example, the dielectric layer can be silicon dioxide, silicon nitride or a low-k dielectric. Subsequently, the dielectric layer is etched to fabricate an opening over the n-well. An interfacial oxide layer is next formed in the opening. Thereafter, a semiconductor layer, which can comprise amorphous silicon for instance, is deposited over the interfacial oxide layer. A layer of silicon-germanium is then grown over the semiconductor layer. In another embodiment, a dielectric layer is deposited over an n-well. The dielectric layer is then etched to fabricate a gap over the n-well between the dielectric layer and an oxide region. Subsequently, a layer of silicon-germanium is grown in the gap. The gap has a gap width which satisfies a pre-determined relation to the thickness of the layer of silicon-germanium.

30 Claims, 9 Drawing Sheets

METHOD FOR FABRICATING LATERAL PNP HETEROJUNCTION BIPOLAR TRANSISTOR AND RELATED STRUCTURE

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

In a silicon-germanium ("SiGe") NPN heterojunction bipolar transistor ("HBT"), a thin P type silicon-germanium layer is grown as the base of a bipolar transistor on a silicon wafer. The silicon-germanium NPN HBT has significant advantages in speed, frequency response, and gain when compared to a conventional silicon bipolar transistor. Cutoff frequencies in excess of 100 GHz, which are comparable to the more expensive gallium-arsenide based devices, have been achieved for the silicon-germanium NPN HBT. Previously, silicon-only devices have not been competitive for use where very high speed and frequency responses are required.

The higher gain, speed and frequency response of the silicon-germanium NPN HBT are possible due to certain advantages of silicon-germanium, such as a narrower band gap and reduced resistivity. Silicon-germanium may be epitaxially grown on silicon wafers using conventional silicon processing and tools which allow one to engineer device properties such as band gap, energy band structure and mobilities. For example, it is known in the art that grading the concentration of germanium in the silicon-germanium base builds into the HBT device an electric field which accelerates the carriers across the base, thereby increasing the speed of the HBT device compared to a silicon-only device.

One method for fabricating silicon-germanium devices is by chemical vapor deposition ("CVD"). In a typical silicon-germanium HBT fabrication process, for example, a reduced pressure CVD technique, or "RPCVD", is used for growing silicon-germanium epitaxially on a silicon wafer. The RPCVD process allows for a controlled grading of germanium across the base layer.

When grown epitaxially on a silicon surface, silicon-germanium crystallizes as a single-crystal layer. The single-crystal silicon-germanium can be deposited over an N type collector region and doped with P type dopants such as boron to function as the P type base of a silicon-germanium NPN HBT. Doping of the epitaxial growth is achieved by adding a precursor for dopant to the gas flow across the silicon surface during the RPCVD process. For example, the precursor for boron is $B_2H_6$. Subsequently, an N type emitter can be fabricated over the silicon-germanium single-crystal P type base to complete fabrication of a vertical silicon-germanium NPN HBT. As already noted, speeds in the range of approximately 100 GHz have been demonstrated for silicon-germanium devices, such as the NPN HBT.

As is known in the art, the fabrication of a silicon-germanium NPN HBT involves more steps than the basic steps described above. The simplified process for fabricating a silicon-germanium NPN HBT described above leaves out such steps as additional doping and etching steps, among others. which can add considerable cost to semiconductor fabrication. Moreover, each step can comprise various sub-steps, for example, masking, washing and cleaning steps, which also increase the cost of fabrication.

A similar sequence of steps used for fabricating a vertical silicon-germanium NPN HBT can be used to fabricate a vertical silicon-germanium PNP HBT. In other words, a layer of silicon-germanium can be deposited epitaxially on a silicon wafer over a P type collector region and doped with N type dopants to function as an N type base in a PNP HBT. Subsequently, a P type emitter can be fabricated on the silicon-germanium base. However, unlike the NPN transistor, the PNP transistor is not a high performance device. The PNP transistor is generally slower than its NPN counterpart and functions typically more as an active bias device, rather than a speed device. And because of its relatively low performance compared to NPN devices, the PNP device is, under most circumstances, less desirable, and the high cost of fabricating the PNP device using the method described above makes it less feasible.

An alternative method for fabricating a silicon-germanium PNP HBT takes advantage of some of the steps utilized in the fabrication of an NPN transistor in order to fabricate a PNP transistor concurrently. For example, in one region of a silicon wafer, a P type silicon-germanium layer deposited over an N type collector region functions as the base of an NPN device; at the same time, the same P type silicon-germanium layer can function as an emitter of a PNP device in another region of the wafer where it is deposited over an n-well. which functions as the base of the PNP device. Further, a region adjacent to the n-well can be doped with P type dopants to function as a P type collector, resulting in the formation of a lateral PNP transistor where the silicon germanium layer functions as a P type emitter. The benefit of incorporating steps for fabricating an NPN device into the fabrication process for a PNP device is the reduction in process complexity and costs, because certain processing steps needed to fabricate a separate P type emitter for a PNP transistor are avoided.

As stated above, silicon-germanium crystallizes as single-crystal when deposited epitaxially on a silicon surface. Thus, when silicon-germanium is deposited over an n-well and doped with P type dopants to function as the emitter of a PNP HBT, the resulting emitter is single-crystal P type emitter. A silicon-germanium PNP HBT comprising a single-crystal emitter has unacceptably low gain, or β, typically in the order of 1/10 to 1/100. Gain, simply stated, is the ratio of collector current, $I_c$. divided by base current, $I_b$, i.e. gain equals $I_c/I_b$. The poor gain can be attributed to a lack of blocking injection control at the emitter-base interface which means that it is just as likely for electrons to flow from the emitter to the base, as it is for holes to migrate in the opposite direction. Thus, although the cost for fabricating a silicon-germanium PNP HBT is reduced by incorporating NPN HBT processing steps, the PNP device resulting from this method has unacceptably low gain.

There is thus a need in the art for method for fabricating a lateral silicon-germanium PNP HBT having a high gain and a low manufacturing cost.

SUMMARY OF THE INVENTION

The present invention is directed to method for fabricating lateral PNP heterojunction bipolar transistor and related structure. The invention results in a PNP heterojunction bipolar transistor having a high gain and a low manufacturing cost.

According to one embodiment of the invention, a dielectric layer is deposited over an n-well. For example, the dielectric layer can be silicon dioxide, silicon nitride or a low-k dielectric. Subsequently, the dielectric layer is etched to fabricate an opening over the n-well. An interfacial oxide layer is next formed in the opening. The thickness of the interfacial oxide layer, which is directly related to the transistor's gain, can be between approximately 9 Angstroms and approximately 13 Angstroms. Moreover, the interfacial oxide layer can comprise. for example, silicon dioxide with a density between approximately $1*10^{15}$ and $3*10^{15}$ atoms per square centimeter. Thereafter, a semiconductor layer, which can comprise amorphous silicon for instance, is deposited over the interfacial oxide layer. In one embodiment, the semiconductor layer is doped with a P type dopant. A layer of silicon-germanium is then grown over the semiconductor layer.

In another embodiment of the invention, a dielectric layer is deposited over an n-well. For example, the dielectric layer can comprise silicon dioxide, silicon nitride or a low-k dielectric. The dielectric layer is then etched to fabricate a gap over the n-well between the dielectric layer and an oxide region. The oxide region can be, for instance, field oxide, shallow trench isolation oxide or local oxidation of silicon oxide ("LOCOS"). Subsequently, a layer of silicon-germanium is grown in the gap. The gap has a gap width which satisfies a pre-determined relation to the thickness of the layer of silicon-germanium. For example, gap width can be restricted to less than twice the thickness of the layer of silicon-germanium. Moreover, a plurality of gaps can be etched in the dielectric layer, with each of the plurality of gaps having a similarly restricted gap width. Thereafter, a layer of silicon-germanium is grown in the plurality of gaps.

DETAILED DESCRIPTION OF THE INVENTION

The present invention is directed to method for fabricating lateral PNP heterojunction bipolar transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
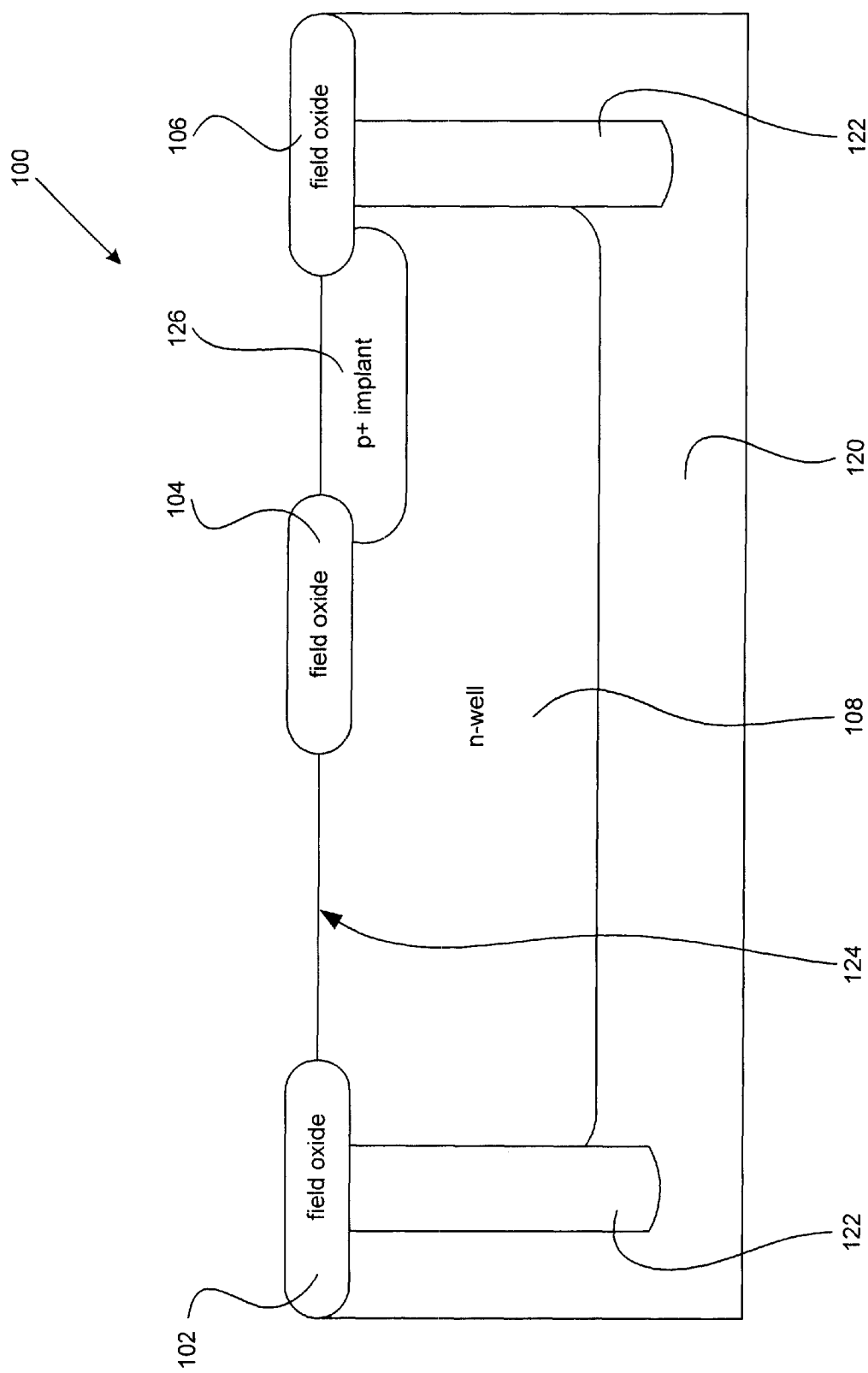
FIG. 1 illustrates a cross sectional view of some of the features of a lateral PNP HBT prior to application of the steps taken to implement embodiments of the present invention.

FIG. 1 shows exemplary structure 100, which is used to describe one embodiment of the present invention. Certain details and features have been left out of FIG. 1 which are apparent to a person of ordinary skill in the art. Structure 100 includes n-well 108. composed of N type material, and implant 126, composed of P type material. It is noted that n-well 108 is also referred to as "well 108" in the present application. Well 108 and implant 126 will function, respectively, as the N type base and P type collector for a silicon-germanium PNP heterojunction bipolar transistor ("HBT"). Well 108 is N type single-crystal silicon, which can be formed using a dopant diffusion process in a manner known in the art. By way of example, well 108 can be doped by an N type dopant, such as phosphorous, with a dose of approximately $1*10^{16}$ atoms per square centimeter. Well 108 has top surface 124 on which further processing in accordance with the present embodiment results in an emitter-base junction of a PNP HBT having acceptably high gain.

Continuing with FIG. 1, deep trench structures 122 and field oxide 102, field oxide 104 and field oxide 106 are formed in a manner known in the art and provide electrical isolation from other devices on semiconductor substrate 120. Although field oxides 102, 104 and 106 comprise silicon dioxide in the present embodiment, a person skilled in the art will recognize that other materials such as silicon nitride, a low-k dielectric, or other suitable dielectric material may be used instead. Field oxides 102, 104 and 106 can also be other forms of isolation, for example local oxidation of silicon ("LOCOS") or shallow trench isolation oxide ("STI"), formed in a manner known in the art. These different forms of isolation, i.e. field oxide, shallow trench isolation oxide, and LOCOS, are also referred to as "oxide regions" in the present application. Although the present embodiment is directed to field oxides comprising silicon dioxide, a person skilled in the art will recognize that other suitable types of isolation may be utilized. Thus, FIG. 1 shows that structure 100 includes several features and components used to form a lateral silicon-germanium PNP HBT at a stage prior to fabrication of a P type emitter over well 108.

Figure 2:
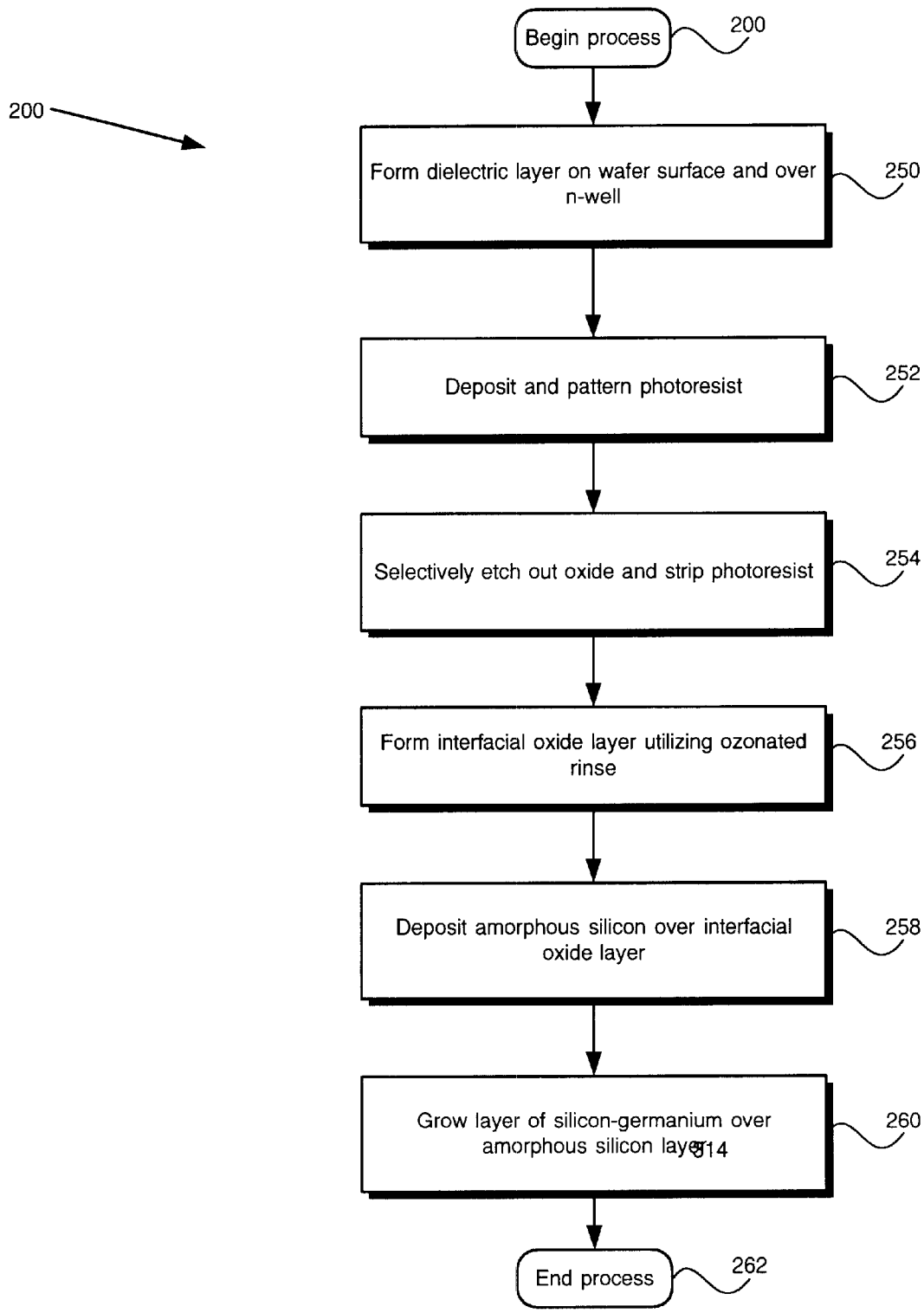
FIG. 2 shows a flowchart illustrating the steps taken to implement an embodiment of the invention.

FIG. 2 shows flowchart 200, which describes the steps in processing a wafer which includes structure 100 of FIG. 1, according to one embodiment. Certain details have been left out of flowchart 200 which are apparent to a person of ordinary skill in the art. For example, a step in flowchart 200 may consist of one or more substeps or may involve specialized equipment, as known in the art. As stated above, certain steps have been left out in order to not obscure the invention.

Steps 200 through 262 indicated in flowchart 200 are sufficient to describe one embodiment of the present invention, and it is noted that other embodiments may use steps different from those shown in flowchart 200. It is further noted that the processing steps shown in flowchart 200 are performed on a wafer which, prior to step 200, includes structure 100 shown in FIG. 1.

Figure 3A:
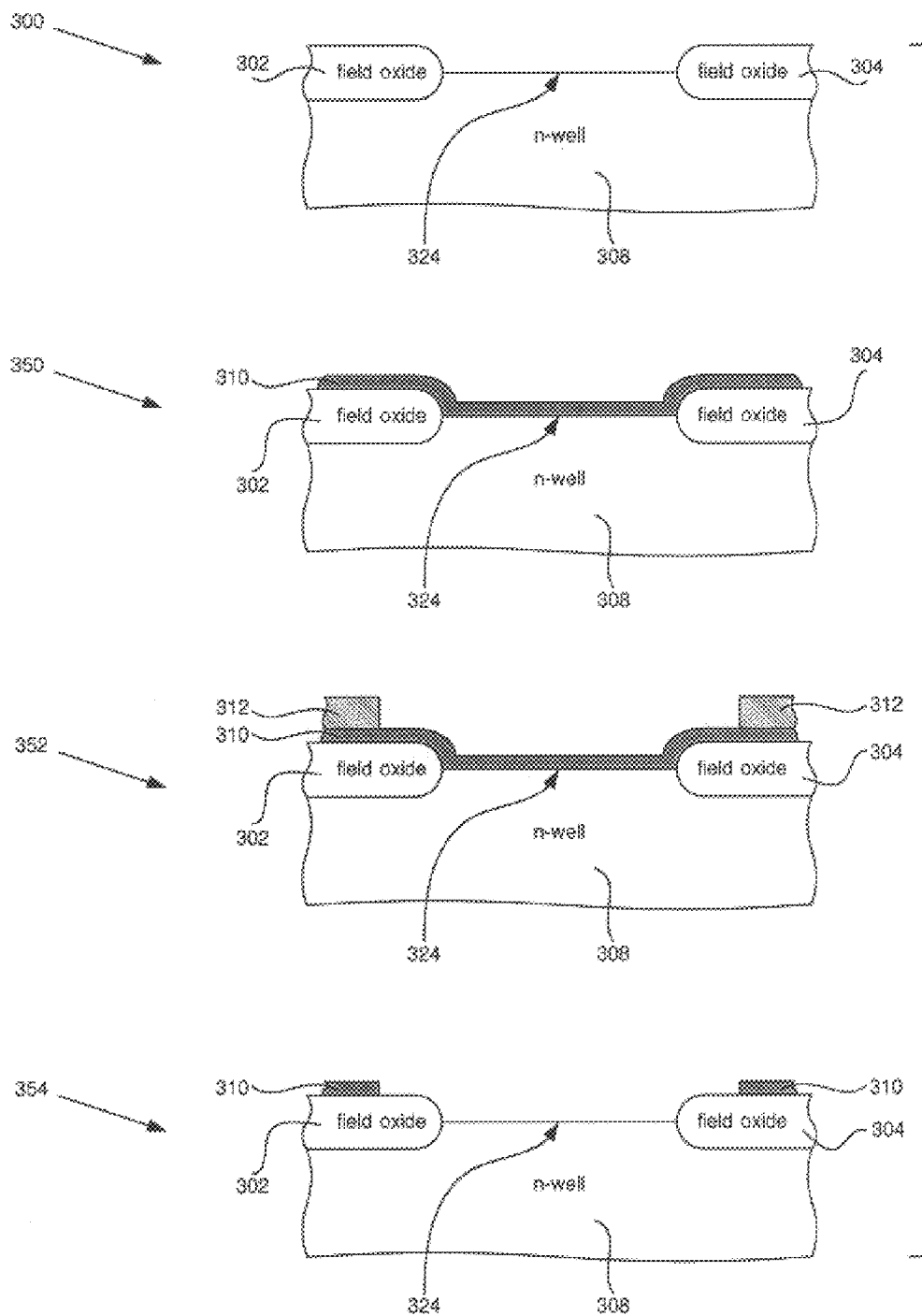
FIG. 3A illustrates cross sectional views, which include portions of a silicon wafer processed according to an embodiment of the invention, corresponding to certain steps of FIG. 2.

Referring now to FIG. 3A, structure 300 of FIG. 3A shows, in greater detail, a portion of structure 100 of FIG. 1. In particular, structure 300 shows a portion of a wafer at step 200, i.e. the starting point, of flowchart 200. Field oxides 102 and 104 are shown respectively in structure 300 as field oxides 302 and 304. Well 108 and top surface 124 of well 108 of structure 100 are shown respectively in structure 300 as well 308 and top surface 324 of well 308. For simplicity, other features such as field oxide 106, deep trench structures 122, implant 126 and silicon substrate 120 are not shown in structure 300. Structure 300 thus shows a portion of a wafer, including top surface 324 of well 308 on which further processing in accordance with the present embodiment results in an emitter-base junction of a PNP HBT having acceptably high gain.

Figure 3B:
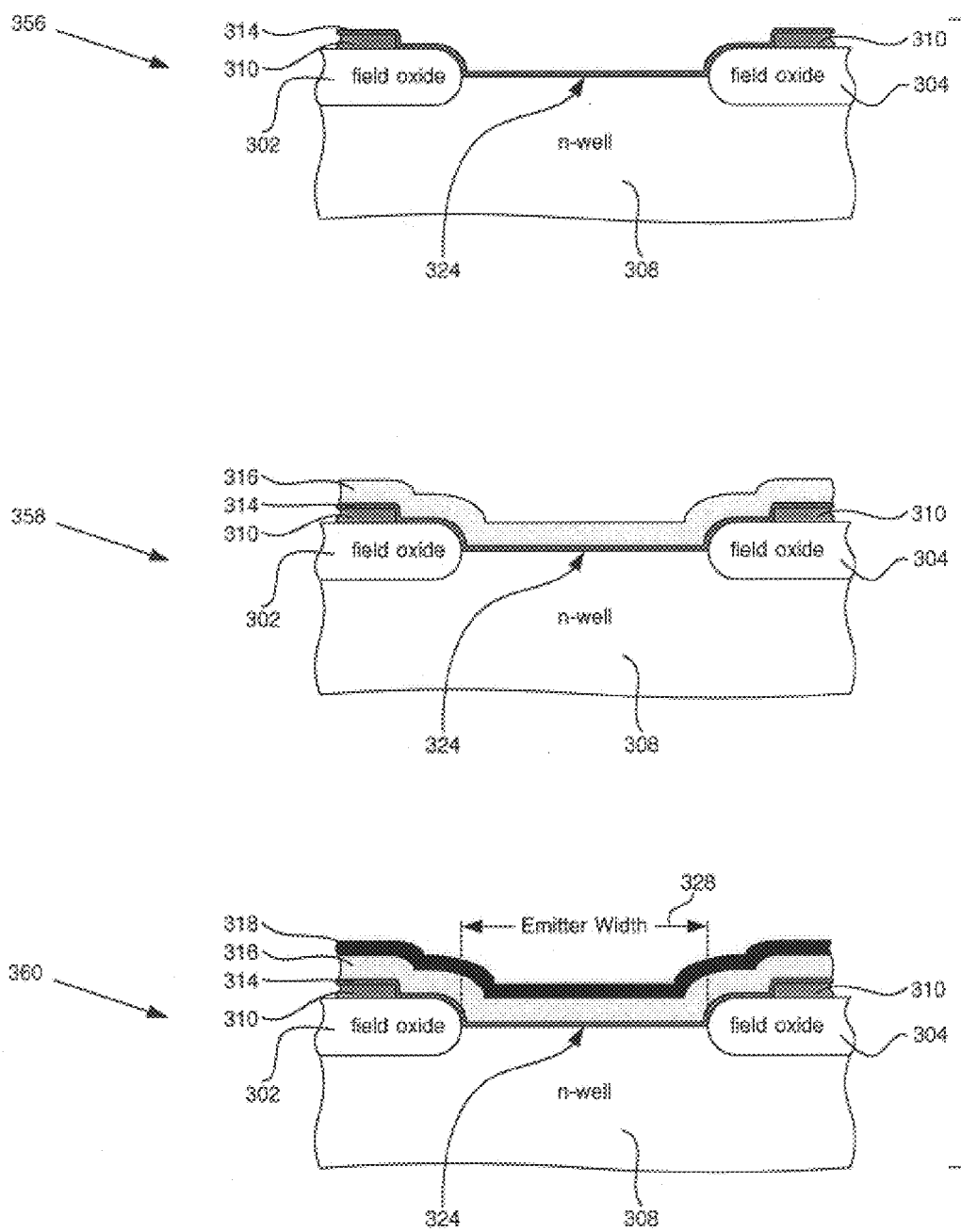
FIG. 3B illustrates cross sectional views, which include portions of a silicon wafer processed according to an embodiment of the invention, corresponding to certain steps of FIG. 2.

Now referring to FIG. 3B as well as to FIG. 3A, each of structures 350, 352, 354, 356, 358 and 360 of FIGS. 3A and 3B illustrates the result of performing, on structure 300, steps 250, 252, 254, 256, 258 and 260, respectively, of flowchart 200 of FIG. 2. For example. structure 350 shows structure 300 after the processing of step 250; structure 352 shows structure 350 after the processing of step 252; and so forth.

Referring now to FIGS. 2 and 3A, step 250 of flowchart 200 comprises depositing a dielectric layer on top surface 324 and field oxides 302 and 304. The dielectric layer can be, for example, a silicon dioxide film deposited using a chemical vapor deposition process ("CVD") with tetraethyl orthosilicate ("SiOC$_2$H$_5$" or "TEOS") as the. SiO$_2$ precursor. An alternative to using TEOS as the silicon dioxide precursor is, for example, by reaction of silane ("SiH$_4$") with nitrous oxide in an argon plasma. The dielectric layer can be in the range of approximately 100 Angstroms to approximately 500 Angstroms. Other suitable dielectrics besides silicon dioxide can be used in step 250 of flowchart 200 such as silicon nitride or a low-k dielectric. Referring to FIG. 3A, the result of step 250 of flowchart 200 is illustrated by structure 350. Thus, structure 350 of FIG. 3A shows structure 300 after the dielectric layer, shown as dielectric layer 310, has been deposited over top surface 324 of well 308, as well as over field oxides 302 and 304.

Continuing with FIGS. 2 and 3A, step 252 of flowchart 200 comprises depositing photoresist 312 over dielectric layer 310 and patterning photoresist 312 in a manner known in the art. While step 252 shows patterning using photoresist, other methods of patterning could be used, as understood by a person of ordinary skill in the art. Referring to FIG. 3A, structure 352 shows photoresist 312 patterned such that the region of dielectric layer 310 over well 308 is exposed. Structure 352 of FIG. 3A thus shows structure 350, including dielectric layer 310, after the addition and patterning of photoresist 312.

Continuing with FIGS. 2 and 3A, step 254 of flowchart 200 comprises selectively etching dielectric layer 310 of structure 352 and stripping photoresist 312. Etching of dielectric layer 310 is done in a manner known in the art using etchants which etch the dielectric without attacking the silicon surface. By way of example, a common etchant utilized to remove an oxide layer such as dielectric layer 310 is hydrofluoric ("HF") acid. Thus, the region of dielectric layer 310 over well 308 can be removed by, for example, an HF bath. Referring to FIG. 3A, the result of etching in step 254 of flowchart 200 is illustrated by structure 354 which shows that the region of dielectric layer 310 on top surface 324 of well 308 has been removed to expose top surface 324.

Referring now to FIGS. 2 and 3B, step 256 of flowchart 200 comprises forming a thin oxide layer over top surface 324 of well 308. Because the thin oxide layer is formed at the interface between the N type base, i.e. well 308, and the P type emitter to be fabricated at a later step, it is also referred to as "interfacial oxide." Interfacial oxide layer 314 can be formed by the rapid thermal oxidation ("RTO") of oxygen at a pre-determined temperature and partial pressure. For example, the pre-determined temperature can be approximately 500° C. However, a temperature in the range of 300° C. to 650° C. can also be used. The oxygen can be supplied in an inert gas at a partial pressure, for example, of approximately 0.1 atmosphere. Generally, when a higher temperature is used, the oxygen partial pressure can be reduced; and conversely when a lower temperature is used, the oxygen partial pressure can be increased. Thus, the oxygen partial pressure can vary significantly from the 0.1 atmosphere which was given above as merely an example. Moreover, although RTO is discussed as a specific example of how interfacial oxide layer 314 can be formed, other methods can be used such as an ozonated rinse, which comprises flowing ozone in water across the wafer surface the ozone reacts with the wafer surface to form oxide on the wafer surface, i.e. on top surface 324. In one embodiment, the density of interfacial oxide layer 134 can be between approximately $1*10^{15}$ to approximately $3*10^{15}$ atoms per square centimeter.

Interfacial oxide layer 314 has the effect of increasing the gain of the PNP device. The interfacial oxide across the emitter opposes the flow of minority carriers so that the base current in one direction is reduced, while the collector current is largely unaffected. Therefore, $I_c/I_b$, which is the gain of the PNP device, is increased. In general, making the interfacial oxide layer thicker increases the gain of the PNP device. Control over the thickness of interfacial oxide layer 314 can be achieved by altering various processing parameters, as is known in the art, including, for example, the temperature and oxygen partial pressure. As another example, the ozonated rinse time can also be manipulated to produce an interfacial oxide of desired thickness. In one embodiment, the thickness of interfacial oxide layer 314 is between approximately 9 Angstroms and approximately 13 Angstroms. Thus, structure 356 shows structure 354 of FIG. 3A following the formation of an interfacial oxide layer over the wafer surface, particularly on top surface 324 of well 308.

Continuing with FIGS. 2 and 3B, step 258 of flowchart 200 comprises depositing a layer of amorphous silicon on interfacial oxide layer 314. For example, amorphous silicon layer 316, which is also referred to as a "semiconductor layer" in the present application, can be deposited epitaxially using a reduced pressure chemical vapor deposition ("RPCVD") process. And because amorphous silicon layer 316 is deposited on an oxide surface, i.e. interfacial oxide layer 314, the silicon re-crystallizes as polycrystalline silicon, rather than single-crystal. In one embodiment, the region of amorphous silicon layer 316 over N type well 308 can be doped with a P type dopant to function as an emitter, forming a PN emitter-base junction with well 308. An example of a P type dopant that can be used is boron. Structure 358 of FIG. 3B, then, shows structure 356, including interfacial oxide layer 314 formed on top surface 324 of well 308, after deposition of amorphous silicon layer 316 on interfacial oxide layer 314.

Continuing with FIGS. 2 and 3B, step 260 of flowchart 200 comprises growing P type silicon-germanium layer 318 on amorphous silicon layer 316 over interfacial oxide layer 314 and top surface 324 of well 308. P type silicon-germanium layer 318 is also referred to as silicon-germanium layer 318 in the present application. Silicon-germanium layer 318 can be deposited epitaxially in a nonselective reduced pressure chemical vapor deposition process ("RPCVD"), with the source of P type dopant being, for example, boron. It is noted that silicon-germanium layer 318 can function as a P type base of a silicon-germanium NPN HBT elsewhere on the wafer. Thus, the present embodiment incorporates a step utilized to fabricate an NPN device in order to fabricate the present PNP device at the same time.

As is known in the art, silicon-germanium deposited epitaxially has different crystallization characteristics, depending on the surface on which it is deposited. When deposited on single-crystal silicon, the silicon-germanium crystallizes as a single-crystal structure; when deposited on polycrystalline silicon, the silicon-germanium crystallizes as polycrystalline. Thus, because silicon-germanium layer 318 is deposited on amorphous silicon layer 316. which re-crystallized as polycrystalline as discussed above, silicon-germanium layer 318 is also polycrystalline. P type silicon-germanium layer 318, deposited over N type well 308, functions as a polycrystalline P type emitter in the silicon-germanium PNP HBT. The emitter width of the PNP HBT, i.e. emitter width 328, is indicated in structure 360 by a pair of dashed lines and arrows and the words "emitter width." Emitter width 328 is defined as the region of P type silicon-germanium layer 318 deposited over N type well 308. Structure 360 of FIG. 3B shows, then, structure 358 including amorphous silicon layer 316, interfacial oxide layer 314 and top surface 324 of well 308 following the deposition of silicon-germanium layer 318 at step 260 of flowchart 200 in FIG. 2. The process for fabricating a lateral silicon-germanium PNP HBT in accordance with the present embodiment then ends at step 262 of flowchart 200.

Figure 4:
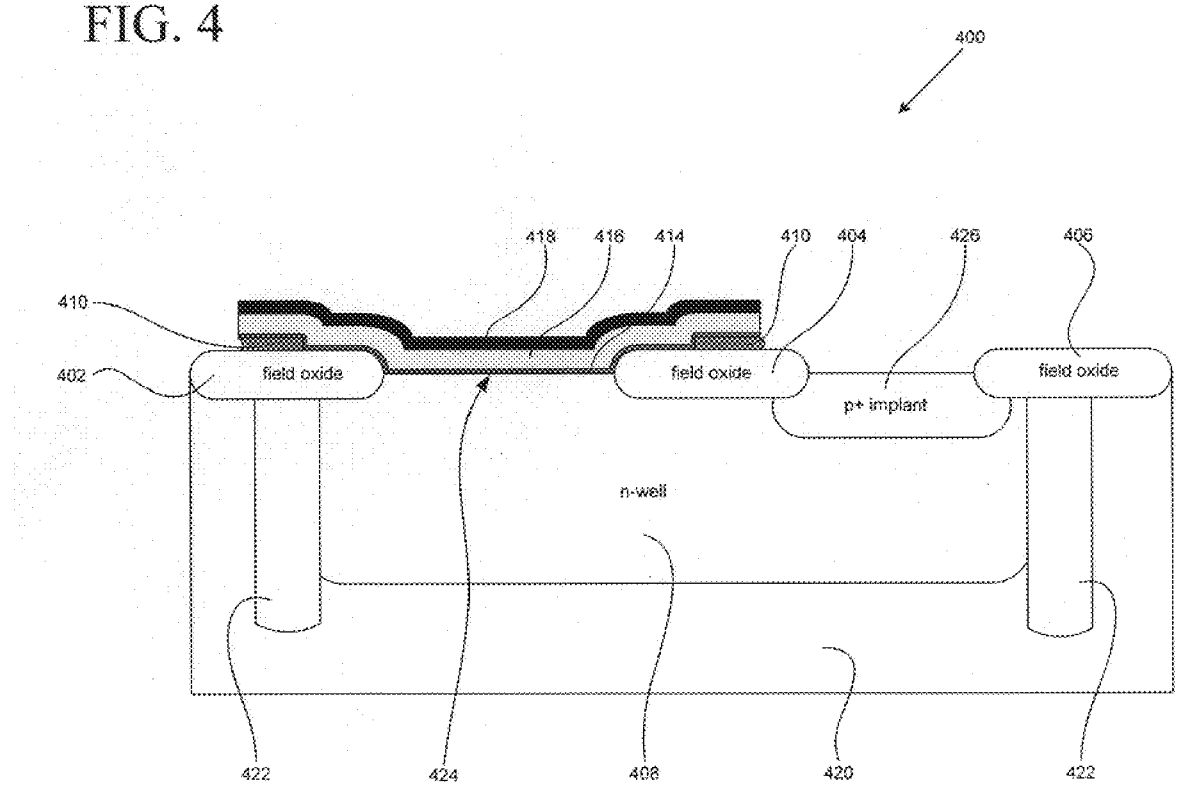
FIG. 4 illustrates a cross sectional view of some of the features of a lateral PNP HBT fabricated in accordance with one embodiment of the present invention.

FIG. 4 shows structure 400 which illustrates structure 100 of FIG. 1 following step 260 of flowchart 200, i.e. after formation of silicon-germanium layer 318, which is P type polycrystalline silicon-germanium, on amorphous silicon layer 316 over interfacial oxide layer 314 and top surface 324 of well 308. In particular, features and components 102, 104, 106, 108, 120, 122, 124 and 126 of structure 100 of FIG. 1 are shown respectively as features and components 402, 404, 406, 408, 420, 422, 424 and 426 of structure 400 of FIG. 4. In addition, dielectric layer 310, interfacial oxide layer 314, amorphous silicon layer 316 and silicon-germanium layer 318 of structure 360 of FIG. 3B are shown respectively in structure 400 of FIG. 4 as dielectric layer 410, interfacial oxide layer 414. amorphous silicon layer 416 and silicon germanium layer 418. Thus, FIG. 4 shows structure 100 subsequent to step 262 of flowchart 200.

Continuing with FIG. 4, structure 400 illustrates that, by the deposition of P type silicon-germanium layer 418 (and the addition and formation of junctions and other structures not shown), a lateral silicon-germanium PNP HBT is formed wherein silicon-germanium layer 418, through amorphous silicon layer 416, functions as the P type emitter, well 408 functions as the N type base and implant 426 functions as the P type collector.

The silicon-germanium PNP HBT illustrated by structure 400 also includes interfacial oxide layer 414 at the emitter-base junction, i.e. where silicon-germanium layer 418 is directly over well 408. As discussed above. because of the control over the thickness of interfacial oxide layer 414 achieved by one embodiment described here, it is also possible to control the gain of the silicon-germanium PNP HBT. In other words, by controlling the thickness of interfacial oxide layer 414, for example by manipulating the time of the ozone rinse, one can directly control the gain of the PNP HBT. In general, making the oxide layer thicker increases the gain, and conversely, making the oxide layer thinner decreases gain. Further, interfacial oxide layer 414 allows amorphous silicon layer 416 to re-crystallize as polycrystalline silicon, rather than single-crystal. It is noted that. in the absence of the interfacial oxide layer, the silicon would align with the underlying crystal structure of well 408 and form a single-crystal silicon layer. The polycrystalline layer, i.e. amorphous silicon layer 416, in turn serves as the nucleation layer for epitaxially deposited P type silicon-germanium layer 418, which aligns with the underlying polycrystalline structure to also assume a polycrystalline structure. As discussed above, a polycrystalline emitter, e.g. P type silicon-germanium layer 418, has a significantly higher gain than a single-crystal emitter. Thus. in the present embodiment of the invention, the formation of a thin interfacial oxide layer and the control over the thickness of that interfacial oxide layer result in a silicon-germanium PNP HBT with high gain, as well as the ability to control the gain of the device.

Figure 5:
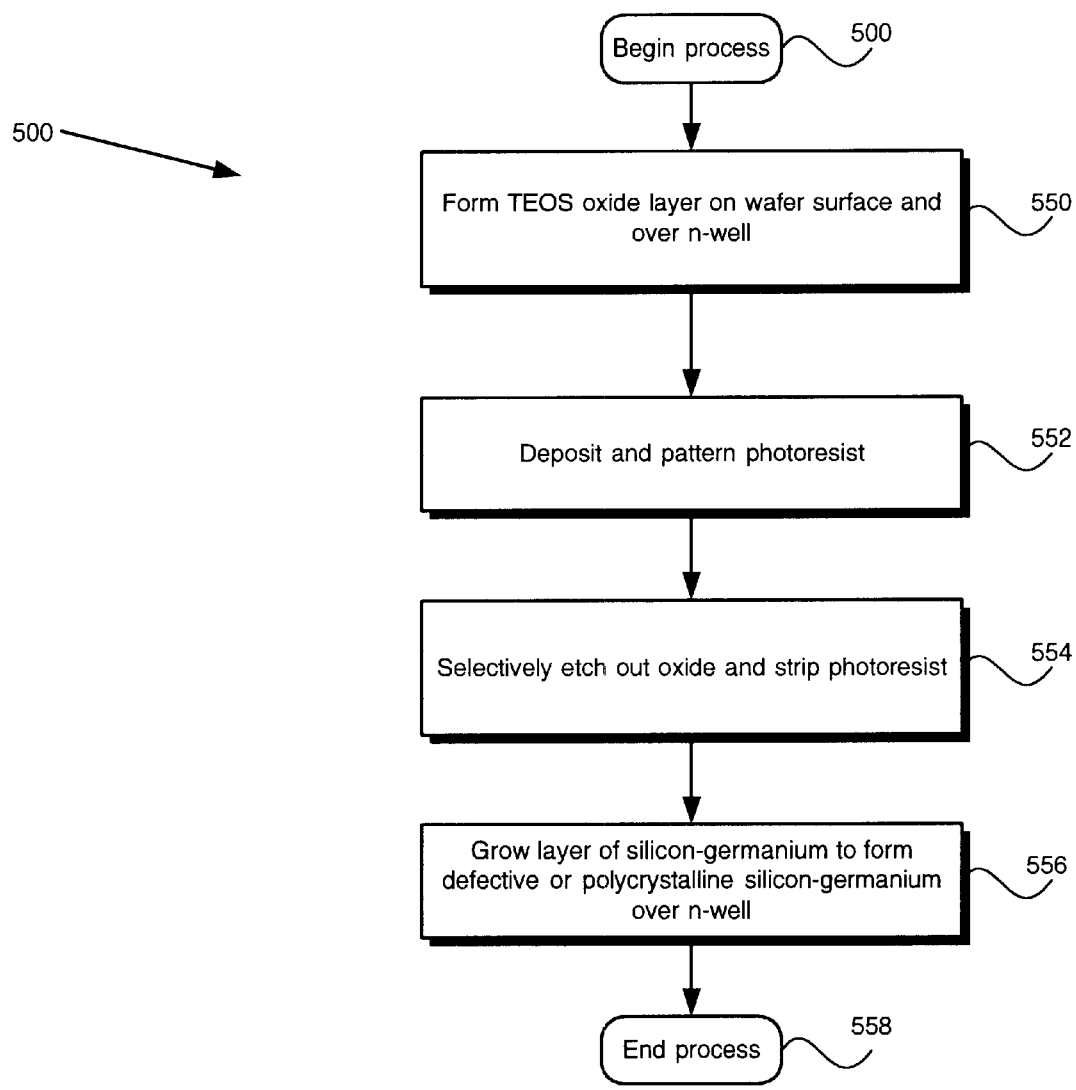
FIG. 5 shows a flowchart illustrating the steps taken to implement an embodiment of the invention.

In another embodiment of the invention, the fabrication of a lateral silicon-germanium PNP HBT with acceptably high gain is also achieved. FIG. 5 shows flowchart 500, which describes the steps, according to one embodiment of the invention, in processing a wafer which includes structure 100 of FIG. 1. Certain details and features have been left out of flowchart 500 which are apparent to a person of ordinary skill in the art. For example, a step may consist of one or more substeps or may involve specialized equipment, as known in the art.

Steps 500 through 258 indicated in flowchart 500 are sufficient to describe one embodiment of the present invention, and it is noted that other embodiments may use steps different from those shown in flowchart 500. It is further noted that the processing steps shown in flowchart 500 are performed on a wafer which, prior to step 500, includes structure 100 shown in FIG. 1.

Figure 6A:
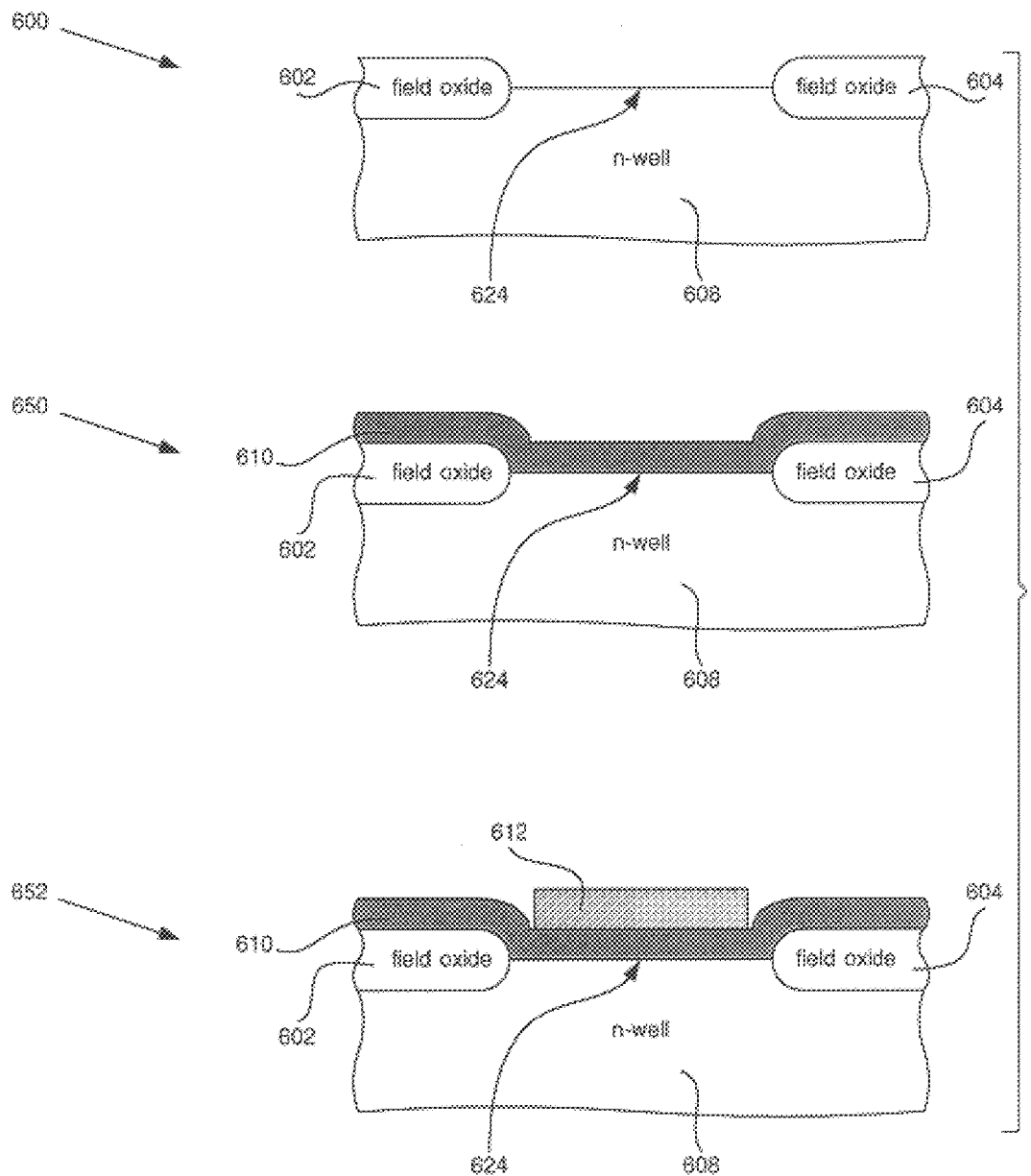
FIG. 6A illustrates cross sectional views, which include portions of a silicon wafer processed according to an embodiment of the invention, corresponding to certain steps of FIG. 5.

Referring now to FIG. 6A. structure 600 of FIG. 6A shows, in greater detail, a portion of structure 100 of FIG. 1. Field oxides 102 and 104 are shown respectively in structure 600 as field oxides 602 and 604. Well 108 and top surface 124 in structure 100 are shown respectively in structure 600 as well 608 and top surface 624. For simplicity, other features such as field oxide 106, deep trench structures 122, implant 126 and silicon substrate 120 are not shown in structure 600. Structure 600 thus shows a portion of a wafer, including top surface 624 of well 608 on which further processing in accordance with the present embodiment results in a lateral silicon-germanium PNP HBT having acceptably high gain. In particular, structure 600 shows a portion of a wafer at step 500, i.e. the starting point, of flowchart 500 of FIG. 5.

Figure 6B:
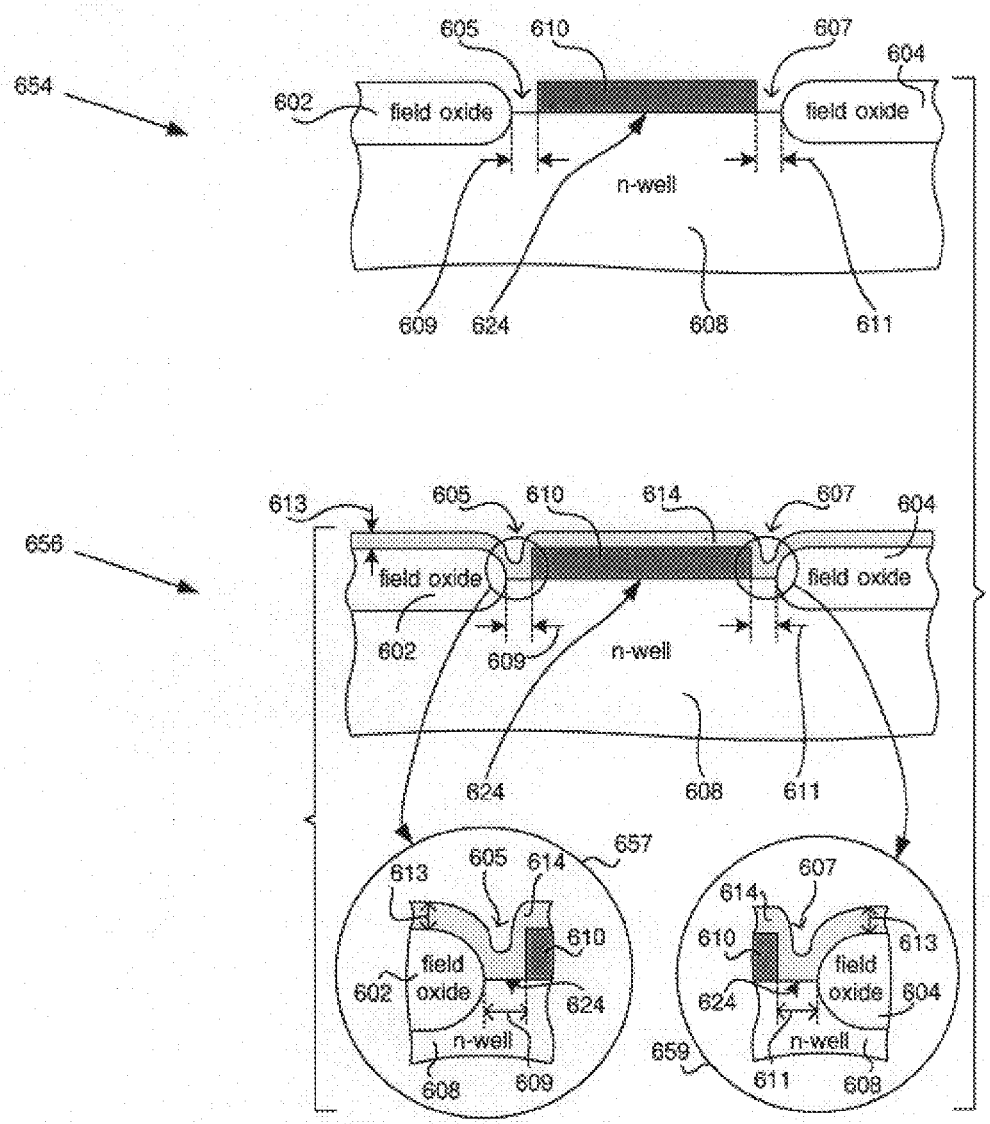
FIG. 6B illustrates cross sectional views. which include portions of a silicon wafer processed according to an embodiment of the invention, corresponding to certain steps of FIG. 5.

Referring to FIGS. 6A and 6B, each of structures 650, 652, 654, 656, 658 and 660 of FIGS. 6A and 6B illustrates the result of performing, on structure 600, steps 550, 552, 554, 556, 558 and 560, respectively, of flowchart 500 of FIG. 5. For example, structure 650 shows structure 600 after the processing of step 550; structure 652 shows structure 650 after the processing of step 552; and so forth.

Referring now to FIGS. 5 and 6A, step 550 of flowchart 500 comprises depositing a layer of dielectric on top surface 624 and field oxides 602 and 604. The dielectric layer can be, for example, TEOS layer 610 which is a silicon dioxide film deposited using a chemical vapor deposition process ("CVD") with tetraethyl orthosilicate ("SiOC$_2$H$_5$" or "TEOS") as the SiO$_2$ precursor. In one embodiment, TEOS layer 610 can be in the range of approximately 1000 Angstroms to approximately 2000 Angstroms. An alternative to using TEOS as the silicon dioxide precursor is, for example, by reaction of silane ("SiH$_4$") with nitrous oxide in an argon plasma. Other suitable dielectrics besides silicon dioxide can be used in step 550 of flowchart 500 such as silicon nitride or a low-k dielectric. Referring to FIG. 6A, the result of step 550 of flowchart 500 is illustrated by structure 650. Thus, structure 650 of FIG. 6A shows structure 600 after a layer of TEOS oxide has been deposited over top surface 624 of well 608, as well as over field oxides 602 and 604.

Continuing with FIGS. 5 and 6A, step 552 of flowchart 500 comprises depositing photoresist 612 over TEOS layer 610 and patterning photoresist 612 in a manner known in the art. While step 552 shows patterning using photoresist, other methods of patterning could be used, as understood by a person of ordinary skill in the art. Structure 652 of FIG. 6A thus shows structure 650. including TEOS layer 610, after the addition and patterning of photoresist 612.

Referring now to FIGS. 5 and 6B, step 554 of flowchart 500 comprises selectively etching TEOS layer 610 of structure 652 and stripping photoresist 612. Etching of TEOS layer 610 is done in a manner known in the art using etchants which etch the dielectric without attacking the silicon surface. By way of example, a common etchant utilized to remove an oxide layer such as TEOS layer 310 is hydrofluoric ("HF") acid in an HF bath. The result of etching in step 554 of flowchart 500 is illustrated in structure 654 of FIG. 6B which shows that TEOS layer 610 on top surface 624 of well 608 is etched back such that only a segment of TEOS layer 610 remains on top surface 624 of well 608. Further, TEOS layer 610 is etched back to fabricate gap 605 between TEOS layer 610 and field oxide 602 and gap 607 between TEOS layer 610 and field oxide 604. Gaps 605 and 607 have widths 609 and 611, respectively, which are defined by dashed lines and arrows and are determined by precise patterning of photoresist 612 at step 552 of flowchart 500. In gaps 605 and 607, top surface 624 of well 608 is exposed for further processing. Thus, structure 654 of FIG. 6R shows structure 652 after TEOS layer 610 has been etched to fabricate gaps 605 and 607 and to expose top surface 624 of well 608 in gaps 605 and 607.

Continuing with FIGS. 5 and 6B. step 556 comprises forming P type silicon-germanium layer 614 over the wafer surface, including field oxides 602 and 604 and TEOS layer 610, and in gaps 605 and 607. P type silicon-germanium layer 614 is also referred to as silicon-germanium layer 614 in the present application. Silicon-germanium layer 614 can be deposited epitaxially in a nonselective RPCVD process with the source of P type dopant being, for example, boron. It is noted that silicon-germanium layer 614 can function as a P type base of a silicon-germanium NPN HBT elsewhere on the wafer. Thus. the present embodiment incorporates a step utilized to fabricate an NPN device in order to fabricate the present PNP concurrently.

Referring to structure 656 and expanded views 657 and 659 of FIG. 6B, silicon-germanium layer 614 has a thickness, i.e. thickness 613 defined by arrows. It is noted that width 609 of gap 605 and width 611 of gap 607 are each less that twice the thickness of the silicon-germanium layer. In other words, the dimension of width 609 is less than twice thickness 613, and the dimension of width 611 is likewise less than twice thickness 613.

As discussed above, silicon-germanium deposited epitaxially has different crystallization characteristics, depending on the surface on which it is deposited. When deposited on oxides such as TEOS layer 610 and field oxides 602 and 604, silicon-germanium crystallizes as polycrystalline; when deposited on bare, or single-crystal silicon, such as top surface 624 of well 608, silicon-germanium crystallizes as single-crystal. Thus, continuing with structure 656 and expanded views 657 and 659 of FIG. 6B, silicon-germanium layer 614 is polycrystalline on field oxides 602 and 604 and TEOS layer 610. However, the expected single-crystal structure which is ordinarily expected to form in gaps 605 and 607, i.e. on exposed top surface 624 of well 608 which is single-crystal silicon, fails to form. Rather, the silicon-germanium forms in gap 605 and 607 as polycrystalline and/or defective epitaxial silicon-germanium.

Silicon-germanium layer 614 crystallizes as polycrystalline and/or defective epitaxial silicon-germanium in gaps 605 and 607, because the polycrystalline silicon-germanium forming on field oxides 602 and 604 and on TEOS layer 610 during the deposition process encroaches on the silicon-germanium growth in gaps 605 and 607 and prevents the silicon-germanium from crystallizing as single-crystal. By limiting the widths of gaps 605 and 607. i.e. widths 609 and 611, respectively, to less than twice the thickness of silicon-germanium layer 614, i.e. thickness 613, the growth of polycrystalline silicon-germanium on field oxides 602 and 604 and on TEOS oxide 610, particularly where field oxides 602 and 604 and TEOS oxide 610 abut gaps 605 and 607, overwhelms the growth of single-crystal silicon-germanium and inhibits single-crystal growth.

The result of step 556 of flowchart 500 of FIG. 5 is the formation of P type polycrystalline silicon-germanium 614 over the exposed areas of top surface 624 of N type well 608 in gaps 605 and 607. The P type polycrystalline silicon-germanium deposited over top surface 624 functions as a P type emitter, resulting in an emitter-base junction at the interface between silicon-germanium layer 614 and top surface 624 of well 608. It is noted that the effective width of the emitter is the combined width of widths 609 and 611. Thus, structure 656 of FIG. 6B shows structure 654 after silicon-germanium layer 614 is deposited over the wafer surface, particularly over top surface 624 in gaps 605 and 607 in accordance with step 556 of flowchart 500 of FIG. 5. The process for fabricating a lateral silicon-germanium PNP HBT in accordance with the present embodiment then ends at step 558 of flowchart 500.

Figure 7:
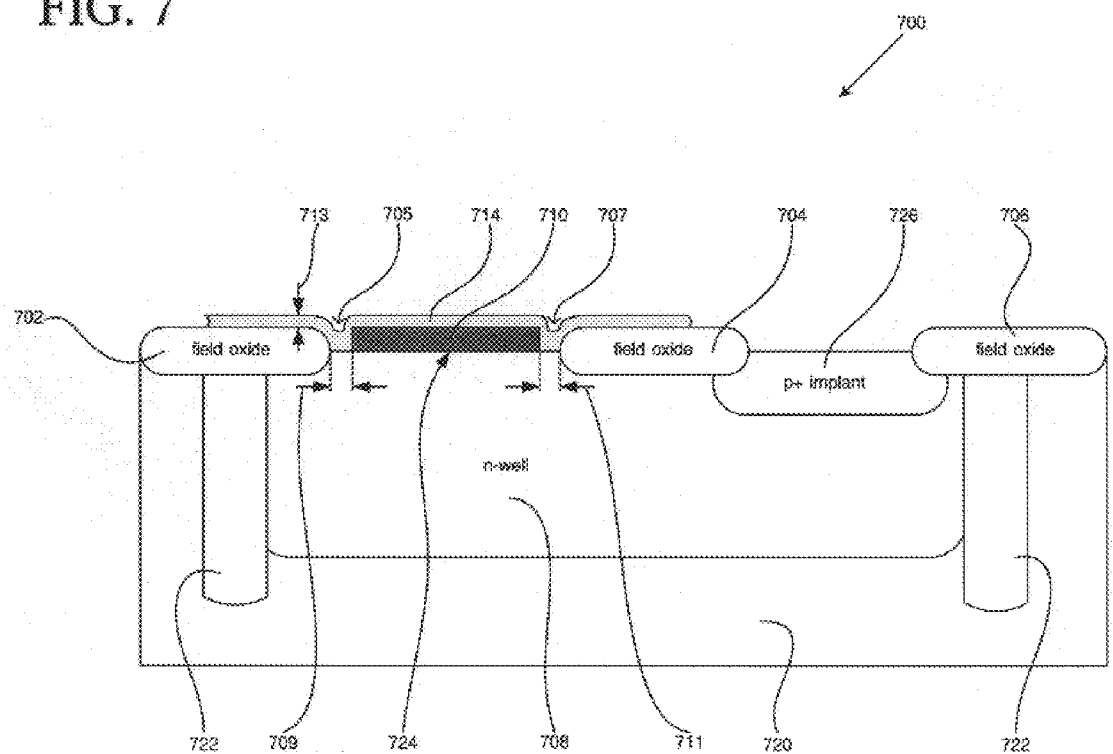
FIG. 7 illustrates a cross sectional view of some of the features of a lateral PNP HBT fabricated in accordance with one embodiment of the present invention.

FIG. 7 shows structure 700 which illustrates structure 100 of FIG. 1 following step 556 of flowchart 500, more specifically after formation of P type silicon-germanium layer 614 over top surface 624 of well 608 in gaps 605 and 607. In particular, features and components 102, 104, 106. 108, 120, 122, 124 and 126 of structure 100 of FIG. 1 are shown respectively as features and components 702, 704, 706, 708, 720, 722, 724 and 726 of structure 700 of FIG. 7. In addition, TEOS layer 610, gaps 605 and 607 comprising widths 609 and 611, respectively, and P type silicon-germanium layer 614 comprising thickness 613 of structure 656 of FIG. 6B are shown respectively in structure 700 of FIG. 7 as TEOS layer 710, gaps 705 and 707, widths 709 and 711 and P type silicon-germanium layer 714 comprising thickness 713. Thus, FIG. 7 shows structure 100 subsequent to step 556 of flowchart 500.

Continuing with FIG. 7, structure 700 illustrates that, by the deposition of P type silicon-germanium layer 714 in gaps 705 and 707 (and the addition and formation of junctions and other structures not shown), a lateral silicon-germanium PNP HBT is formed wherein silicon-germanium layer 714 functions as the P type emitter, well 708 functions as the N type base and implant 726 functions as the P type collector.

As already discussed, the silicon-germanium formed over top surface 724 in gaps 705 and 707 is polycrystalline and/or defective epitaxial silicon-germanium, rather than single-crystal as ordinarily expected where silicon-germanium is formed over single-crystal silicon. Silicon-germanium layer 714 forms as polycrystalline over top surface 724 because the polycrystalline silicon-germanium growing on field oxides 702 and 704 and on TEOS layer 710 encroaches on the growth of silicon-germanium over top surface 724 and prevents single-crystal growth. It is noted that the widths of gaps 705 and 707, i.e. widths 709 an 711, are limited to less than twice the thickness of silicon-germanium layer 714. i.e. thickness 714, which promote the growth of polycrystalline silicon-germanium in gaps 705 and 707. Thus, in accordance with the present embodiment, the formation of P type silicon-germanium layer 714, which is polycrystalline and functions as an emitter in gaps 705 and 707, results in a lateral silicon-germanium PNP HBT with significantly higher gain than comparable devices comprising a single-crystal emitter.

In another embodiment, a dielectric layer, which can be for example, TEOS oxide, deposited over an n-well, or N type base region, is etched into a plurality of segments. The dielectric segments are separated from each other by gaps comprising widths limited to less than twice the thickness of a P type silicon-germanium layer which is formed over the dielectric segments and in the gaps at a subsequent step. The relative narrowness of the widths of the gaps forces the silicon-germanium to crystallize as polycrystalline in the gaps, rather than single-crystal, which results in a plurality of polycrystalline emitters, i.e. the P type silicon-germanium formed in each gap, having significantly higher gain than single-crystal emitters. The present embodiment also permits the fabrication of multiple emitter-base junctions over an n-well.

It is appreciated by the above detailed disclosure that this invention provides method for fabricating lateral PNP heterojunction bipolar transistor and related structure in which the polycrystalline P type emitter results in higher gain. In one embodiment, the formation of an interfacial oxide layer over an N type base prior to deposition of a P type emitter layer results in higher gain and better control of gain. In another embodiment, the fabrication of relatively narrow gaps between regions of oxide over an N type base region and the deposition of P type silicon germanium in the. gaps produce polycrystalline emitter having acceptably high gain. Although the invention is described as applied to the construction of a silicon-germanium PNP HBT, it will be apparent to a person of ordinary skill in the art how the invention can be applied in similar situations where it is desirable to increase the gain of a PNP device.

From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. For example, as stated above, although interfacial oxide layer 414 can be formed by utilizing a rapid thermal oxidation process, interfacial oxide layer 414 could also be formed utilizing an ozonated rinse.

As another example, TEOS layer 710 can be replaced by other dielectrics such as silicon nitride without departing from the scope of the present invention. The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for fabricating lateral PNP heterojunction bipolar transistor and related structure have been described.

What is claimed is:

1. A method for fabricating a lateral PNP transistor, said method comprising steps of:

depositing a dielectric layer on a top surface of an n-well in a semiconductor substrate;

etching said dielectric layer so as to fabricate an opening over said n-well, said top surface of said n-well being exposed in said opening;

forming an interfacial oxide layer on said top surface of said n-well in said opening;

depositing a semiconductor layer over said interfacial oxide layer;

growing a layer of silicon-germanium over said semiconductor layer.

2. The method of claim 1 wherein said dielectric layer comprises material selected from the group consisting of silicon dioxide, silicon nitride, and a low-k dielectric.

3. The method of claim 1 wherein a thickness of said dielectric layer is between 100 Angstroms and 500 Angstroms.

4. The method of claim 1 wherein said interfacial oxide layer comprises silicon dioxide.

5. The method of claim 1 wherein said interfacial oxide layer comprises silicon dioxide at a density between $1*10^{15}$ and $3*10^{15}$ atoms per square centimeter.

6. The method of claim 1 wherein a thickness of said interfacial oxide layer is between 9 Angstroms and 13 Angstroms.

7. The method of claim 1 wherein said semiconductor layer comprises amorphous silicon.

8. The method of claim 1 further comprising a step of doping said semiconductor layer with a P type dopant after said step of depositing said semiconductor layer and before said step of growing said layer of silicon-germanium.

9. A lateral PNP transistor structure, said structure comprising:

an opening in an n-well in a semiconductor substrate;

an interfacial oxide layer situated on a top surface of said n-well in said opening;

a semiconductor layer situated over said interfacial oxide layer;

a layer of silicon-germanium over said semiconductor layer.

10. The structure of claim 9 wherein said interfacial oxide layer comprises silicon dioxide.

11. The structure of claim 9 wherein said interfacial oxide layer comprises silicon dioxide at a density between $1*10^{15}$ and $3*10^{15}$ atoms per square centimeter.

12. The structure of claim 9 wherein a thickness of said interfacial oxide is between 9 Angstroms and 13 Angstroms.

13. The structure of claim 9 wherein said semiconductor layer comprises amorphous silicon.

14. The structure of claim 9 wherein said semiconductor layer is doped with a P type dopant.

15. A method for fabricating a lateral PNP transistor, said method comprising steps of:

depositing a dielectric layer on a top surface of an n-well in a semiconductor substrate;

etching said dielectric layer so as to fabricate a gap over said n-well directly between said dielectric layer and an oxide region, said oxide region in contact with said n-well, said gap having a gap width, said gap exposing a portion of said top surface of said n-well;

growing a layer of silicon-germanium in said gap, said layer of silicon-germanium having a layer thickness, wherein said gap width satisfies a pre-determined relation relative to said layer thickness so as to prevent formation of single-crystal silicon-germanium on said portion of said top surface of said n-well.

16. The method of claim 15 wherein according to said pre-determined relation said gap width is less than twice said layer thickness.

17. The method of claim 15 wherein said dielectric layer comprises silicon dioxide.

18. The method of claim 15 wherein said dielectric layer comprises material selected from the group consisting of silicon dioxide. silicon nitride, and a low-k dielectric.

19. The method of claim 15 wherein a thickness of said dielectric layer is between 1000 Angstroms and 2000 Angstroms.

20. The method of claim 15 wherein said oxide region is selected from the group consisting of field oxide, shallow trench isolation oxide, and LOCOS.

21. The method of claim 15 further comprising steps of:

etching said dielectric layer so as to fabricate a plurality of gaps in said dielectric layer over said n-well, each of said plurality, of gaps having said gap width;

growing said layer of silicon-germanium in said plurality of gaps.

22. A lateral PNP transistor structure, said structure comprising:

a dielectric layer situated on a top surface of an n-well;

a gap directly between said dielectric layer and an oxide region, said oxide region in contact with said n-well, said gap having a gap width, said gap exposing a portion of said top surface of said n-well;

a layer of silicon-germanium in said gap, said layer of silicon-germanium having a layer thickness, wherein said gap width satisfies a pre-determined relation relative to said layer thickness so as to prevent formation of single-crystal silicon-germanium on said portion of said top surface of said n-well.

23. The structure of claim 22 wherein according to said pre-determined relation said gap width is less than twice said layer thickness.

24. The structure of claim 22 wherein said dielectric layer comprises silicon dioxide.

25. The structure of claim 22 wherein said dielectric layer comprises material selected from the group consisting of silicon dioxide, silicon nitride, and a low-k dielectric.

26. The structure of claim 22 wherein a thickness of said dielectric layer is between 1000 Angstroms and 2000 Angstroms.

27. The structure of claim 22 wherein said oxide region is selected from the group consisting of field oxide, shallow trench isolation oxide, and LOCOS.

28. The structure of claim 22 further comprising:

a plurality of gaps in said dielectric layer over said n-well, each of said plurality of gaps having said gap width;

said layer of silicon-germanium in said plurality of gaps.

29. A method comprising steps of:

depositing a dielectric layer over an n-well;

etching said dielectric layer so as to fabricate a plurality of gaps in said dielectric layer over said n-well, each of said gaps having a gap width;

growing a layer of silicon-germanium in said plurality of gaps, said layer of silicon-germanium having a layer thickness, wherein said gap width satisfies a pre-determined relation relative to said layer thickness.

30. A structure comprising:

a dielectric layer situated over an n-well;

a plurality of gaps in said dielectric layer over said n-well, each of said plurality of gaps having a gap width;

a layer of silicon-germanium in said plurality of gaps, said layer of silicon-germanium having a layer thickness, wherein said gap width satisfies a pre-determined relation relative to said layer thickness.

* * * * *